United States Patent
Yu et al.

(10) Patent No.: US 6,184,155 B1
(45) Date of Patent: Feb. 6, 2001

(54) METHOD FOR FORMING A ULTRA-THIN GATE INSULATOR LAYER

(75) Inventors: Mo-Chiun Yu, Taipei; Syun-Ming Jang; Mong-Song Liang, both of Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/596,902

(22) Filed: Jun. 19, 2000

(51) Int. Cl.$^7$ ............................. H01L 21/31; H01L 21/469
(52) U.S. Cl. ............................ 438/763; 430/758; 430/787
(58) Field of Search ....................... 438/758, 763, 438/787

(56) References Cited

U.S. PATENT DOCUMENTS

| | | | |
|---|---|---|---|
| 3,925,107 | 12/1975 | Gdula et al. | 148/1.5 |
| 4,140,548 | 2/1979 | Zimmer | 148/1.5 |
| 5,244,843 | * 9/1993 | Chau et al. | 437/239 |
| 5,591,681 | 1/1997 | Wristers et al. | 437/240 |
| 5,817,581 | 10/1998 | Bayer et al. | 438/770 |
| 5,891,809 | * 4/1999 | Chau et al. | 438/770 |
| 5,940,736 | 8/1999 | Brady et al. | 438/787 |
| 5,972,779 | 10/1999 | Jang | 438/452 |
| 6,114,258 | * 9/2000 | Miner et al. | 438/787 |

* cited by examiner

Primary Examiner—John F. Niebling
Assistant Examiner—Alexander G. Ghyka
(74) Attorney, Agent, or Firm—George O. Saile; Stephen B. Ackerman

(57) ABSTRACT

A process for forming an ultra-thin, silicon dioxide, gate insulator layer, for narrow channel length MOSFET devices, has been developed. The process features the use of a two step, in situ steam generated, (ISSG), procedure, to grow a silicon dioxide layer at a physical thickness between about 10 to 20 Angstroms, offering a gate insulator layer with a reduction in leakage current, during standby, or operating modes, when compared to counterpart silicon dioxide layers, formed without the use of the two step, ISSG procedure. The two step, ISSG procedure is comprised of a first step, featuring a steam oxidation, and an in situ anneal, in a nitrous oxide ambient, followed by the second step of the two step, ISSG procedure, performed in situ, in the same furnace used for the first step of the two step, ISSG procedure, with the second step of the two step, ISSG procedure again comprised of a steam oxidation, followed by an in situ anneal, performed in a nitrous oxide ambient.

18 Claims, 2 Drawing Sheets

METHOD FOR FORMING A ULTRA-THIN GATE INSULATOR LAYER

BACKGROUND OF THE INVENTION (1) Field of the Invention

The present invention relates to methods used to fabricate semiconductor devices, and more specifically to a method used to form a silicon dioxide, gate insulator layer, for a metal oxide semiconductor field effect transistor, (MOSFET), device.

(2) Description of Prior Art

The advent of micro-miniaturization, or the use of sub-micron features, for MOSFET devices, have necessitated the use of ultra-thin, gate insulator layers. For example, the use of 0.13 um, (or channel lengths of 0.13 um), technology, results in a projected gate insulator layer, with a thickness in the range of 10 to 20 Angstroms. The use of these ultra-thin gate insulator layers, such as thermally grown silicon dioxide, can present unacceptable leakage rates, during the operation of the 0.13 um MOSFET device. In addition significant, and unacceptable, gate insulator leakage can occur during the standby, or off mode, of the narrow channel length MOSFET device.

This invention will teach a process for forming ultra-thin, silicon dioxide gate insulator layers, in which the leakage rate of the thin silicon dioxide layer is reduced, when compared to counterparts formed without the use of the process described in this present invention. Prior art, such as Gdula et al, in U.S. Pat. No. 3,925,107, describe a post-oxidation, anneal process, which reduces the fixed charge, and fast states, in silicon dioxide, gate layers as thin as 100 Angstroms. However that prior art does not teach the novel process, now presented, allowing ultra-thin, silicon dioxide layers to be used for sub-micron MOSFET devices, featuring reductions in leakage currents, when compared to counterparts fabricated without the benefit of this invention.

SUMMARY OF THE INVENTION

It is an object of this invention to fabricate an MOSFET device featuring a silicon dioxide gate insulator between about 10 to 20 Angstroms in physical thickness.

It is another object of this invention to employ a gate insulator layer formation process, featuring the attainment of an initial silicon dioxide layer, formed via a first, in situ steam generated, (ISSG), growth, and in situ anneal procedure, followed in situ, by a second, ISSG growth, and another in situ anneal procedure, resulting in a final silicon dioxide layer.

It is still another object of this invention to perform the in situ anneal cycles, for the first, and for the second ISSG growth and in situ anneal procedures, in a nitrous oxide, (NO), ambient.

In accordance with the present invention a method of forming an ultra-thin, (between about 10 to 20 Angstrom), silicon dioxide layer, for use as a gate insulator layer in narrow channel length MOSFET devices, is described. After formation of a well region, in a semiconductor substrate, a silicon dioxide layer is formed using a two step procedure. An first, in situ steam generation, (ISSG), procedure is used to establish an initial silicon dioxide layer, with the first ISSG procedure comprised of an oxidation step, followed by an in situ anneal, performed in a nitrous oxide ambient. A second, ISSG procedure, is next performed in situ, again comprised of a oxidation procedure, followed by another in situ, nitrous oxide anneal. Formation of a gate structure; a lightly doped source/drain regions; insulator spacers on the sides of the gate structure; and a heavily doped source/drain region; complete the fabrication of the narrow channel MOSFET device, featuring a silicon dioxide gate insulator layer, obtained via a two step, ISSG procedure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a MOSFET device, featuring an ultra-thin, silicon dioxide gate insulator layer, obtained via a two step, in situ steam generated, (ISSG), procedure, will now be described in detail. The ultra-thin, silicon dioxide gate insulator layer, obtained using the two step ISSG procedure, will be applied to a P channel, or PMOS, device. However the two step, ISSG grown, silicon dioxide gate insulator layer, can also be used for N channel, or NMOS devices.

Figure 1:
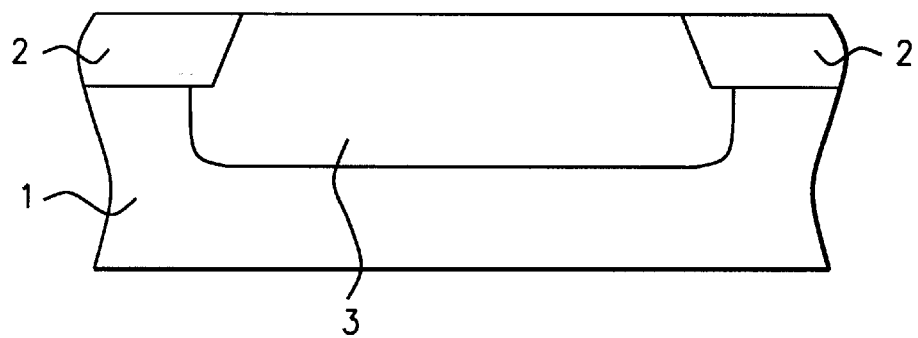
FIGS. 1–4, which schematically, in cross-sectional style, show key stages of fabrication, used to form a MOSFET device featuring an ultra-thin, gate insulator layer.

A semiconductor substrate 1, comprised of P type, single crystalline silicon, with a <100> crystallographic orientation, is used and schematically shown in FIG. 1. Isolation regions 2, comprised of silicon oxide, defined as either shallow trench isolation, (STI), or field oxide, (FOX), regions, are next formed in portions of semiconductor substrate 1. The STI version is created via initially forming a shallow trench in semiconductor substrate 1, via conventional photolithographic and reactive ion etching, (RIE), procedures, followed by filling of the shallow trench with silicon oxide, via a low pressure chemical vapor deposition, (LPCVD), or a plasma enhanced chemical vapor deposition, (PECVD), procedure. A chemical mechanical polishing procedure is then employed to remove portions of the silicon oxide layer, from the top surface of semiconductor substrate 1, resulting in the desired STI region. A FOX isolation region, if used as isolation region 2, is obtained via thermal oxidation of exposed regions of semiconductor substrate 1, not protected by an oxidation resistant mask pattern, such as silicon nitride. After formation of the FOX isolation region, the oxidation resistant mask pattern is selectively removed. Well region 3, an N well region for this illustration, is next formed in semiconductor substrate 1, via conventional photolithographic and ion implantation procedures. After forming a masking photoresist shape, not shown in the drawings, an ion implantation procedure, performed using phosphorous or arsenic ions, at an energy between about 40 to 80 KeV, at a dose between about 4E15 to 8E15 atoms/cm$^2$, is employed to create N well region 3, schematically shown in FIG. 1. If this invention, the use of an ultra-thin, silicon dioxide gate insulator layer, is applied to a NMOS device, well region would be a P well region, formed using boron or $BF_2$ implanted ions. The photoresist shape, used as a mask for definition of N well region 3, is removed via plasma oxygen ashing and careful wet cleans.

Figure 2:
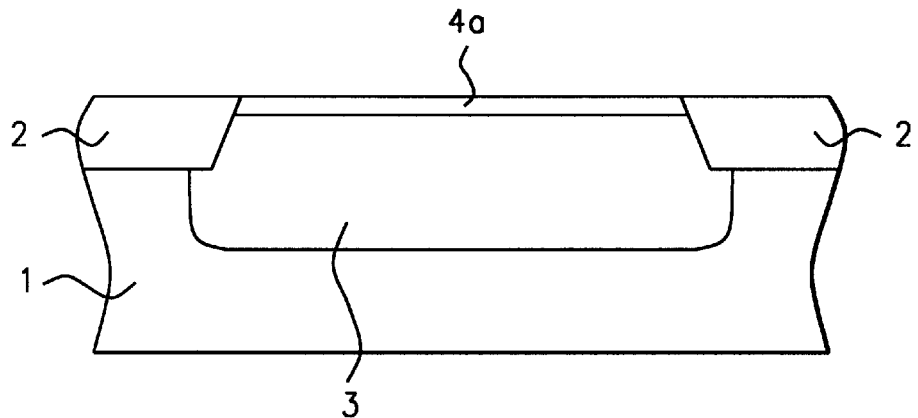

The method of forming the two step, ISSG, ultra-thin silicon dioxide layer, to be used as the gate insulator for a narrow channel length MOSFET device, will next be addressed. A pre-clean procedure, using a dilute hydrofluoric acid (DHF), solution is used prior to initiation of the first step, of the two step, ISSG procedure. The first step, of the two step ISSG procedure, comprises the growth of an initial silicon dioxide layer, performed in a conventional furnace, followed by an in situ anneal procedure, resulting in initial silicon dioxide layer 4a, schematically shown in FIG. 2. Silicon dioxide layer 4a, is thermally grown in a steam ambient, at a temperature between about 600 to 900° C., resulting in a physical thickness for initial silicon dioxide layer 4a, between about 8 to 12 Angstroms. The electrical thickness of silicon dioxide layer 4a, which is measured when the MOSFET device is in an inversion mode, is greater, between about 15 to 20 Angstroms. At the conclusion of the oxidation procedure, an in situ anneal cycle, is performed in a nitrous oxide ambient, at a temperature between about 800 to 1000° C., for a time between about 10 to 30 sec., to reduce surface states residing at the silicon dioxide—substrate interface.

Figure 3:
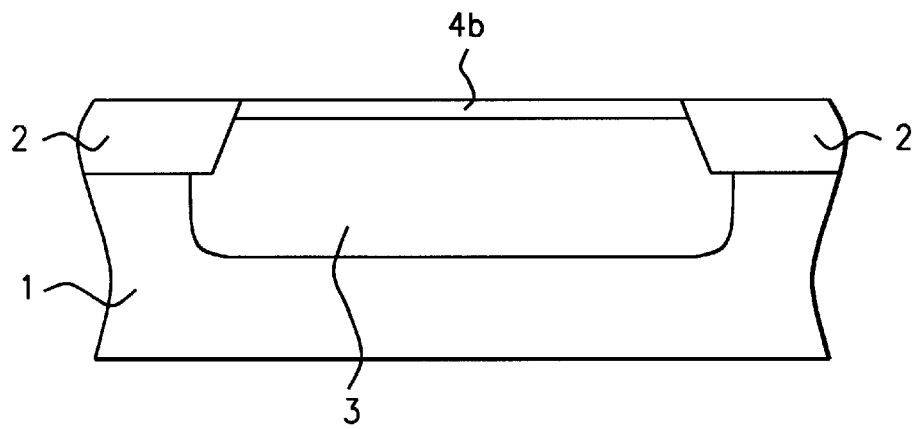

The second step, of the two step ISSG procedure, is then performed, in situ, in the same furnace used for the first step, of the two step procedure, without exposure of initial silicon dioxide layer 4a, to the environment. The second step, of the two step ISSG procedure initiates with a thermal oxidation procedure, performed in a steam environment, at a temperature between about 600 to 800° C., followed by another in situ anneal procedure, again performed in a NO ambient, at a temperature between about 800 to 1000° C., for a time between about 10 to 30 sec., The second step, of the two step ISSG procedure, results in the attainment of final, silicon dioxide layer 4b, schematically shown in FIG. 3, at a physical thickness between about 10 to 20 Angstroms, or at an electrical thickness between about 20 to 25 Angstroms.

Figure 4:
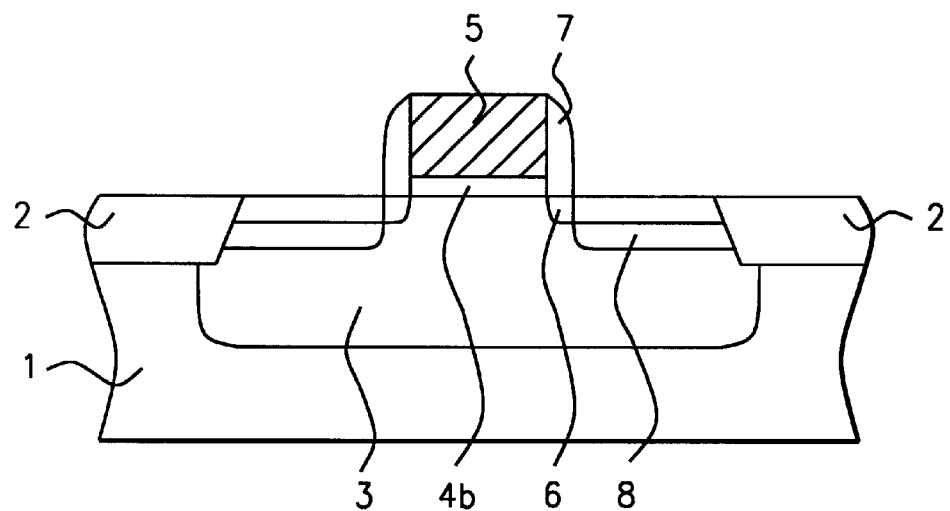

The completion of the MOSFET device, featuring silicon dioxide, gate insulator layer 4b, obtained via the two step, ISSG procedure, is next addressed, and schematically shown in FIG. 4. A polysilicon layer is deposited via LPCVD procedures, at a thickness between about 1000 to 2500 Angstroms. The polysilicon layer can be doped in situ, during deposition, via the addition of phosphine, or arsine to a silane ambient, or the polysilicon layer can be deposited intrinsically then doped via implantation of arsenic or phosphorous ions. Conventional photolithographic and RIE procedures, using $Cl_2$ as an etchant for the polysilicon layer, are used to create polysilicon gate structure 5. If desired, lower word line resistance can be obtained via the use of a polycide gate structure, comprised of an overlying metal silicide layer, such as tungsten silicide, on an underlying polysilicon layer. Lightly doped, P type source/drain region 6, is next formed via implantation of boron or $BF_2$ ions. If an NMOS device is desired, an N type, lightly doped source/drain region would be formed via implantation of arsenic or phosphorous ions. Insulator spacers 7, are next formed on the sides of gate structure 5, via deposition of a silicon oxide, or of a silicon nitride layer, via LPCVD or PECVD procedures, at a thickness between about 1000 to 2000 Angstroms, followed by an anisotropic RIE procedure, performed using $CHF_3$ of $CF_4$ as an etchant. Finally heavily doped, P type source/drain regions 8, are formed via implantation of boron, or $BF_2$ ions. Again if an NMOS device is being fabricated, a heavily doped, N type source/drain region would be used, obtained via implantation of arsenic or phosphorous ions.

Figure 5:
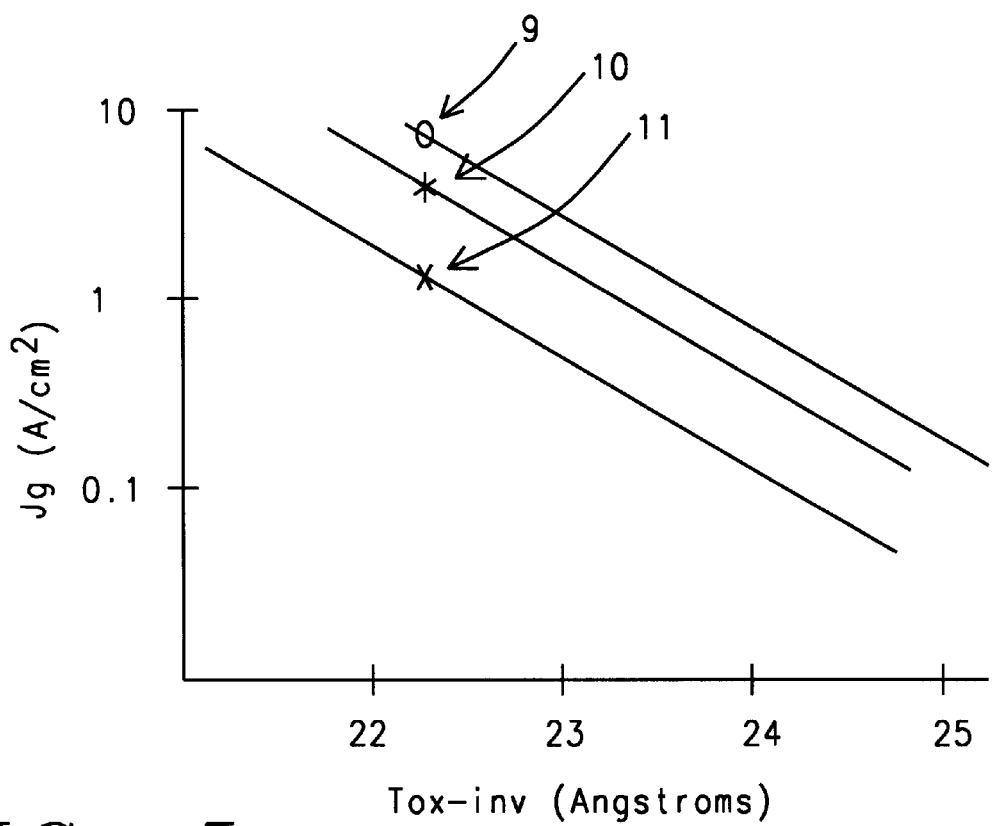
FIG. 5, which graphically represents the leakage current, as a function of gate insulator thickness, of several ultra-thin, silicon dioxide gate insulator layers, including the ultra-thin silicon dioxide layer, featured in this invention, obtained via a two step ISSG procedure.

The advantage of forming a silicon dioxide, gate insulator layer, via the two step, ISSG procedure, described in this invention, is graphically illustrated in FIG. 5. The leakage current density, $(J_g)$, for silicon dioxide layers, in PMOS devices, are shown as a function of the electrical thickness of the gate insulator layer. It can be seen that for a silicon dioxide, gate insulator layer, at an electrical thickness of about 22 Angstroms, the leakage for the two step, ISSG, silicon dioxide layer 11, described in this invention, is only at about 2 amps/cm$^2$. Silicon dioxide layer 10, formed using the two step procedure, oxidation and in situ anneal in NO, but however allowing exposure of the initial silicon oxide layer to the atmosphere, prior to the second step, or prior to formation of the final silicon dioxide layer, resulted in a leakage of about 5 amps/cm$^2$, while sample 9, prepared using only the first step, of the two step, ISSG procedure, resulted in a leakage of about 7 amps/cm$^2$.

While this invention has been particularly shown and described with reference to, the preferred embodiments thereof, it will be understood by those skilled in the art that various changes in form and details may be made without departing from the spirit and scope of this invention.

What is claimed is:

1. A method of forming a gate insulator layer, for a metal oxide semiconductor field effect transistor, (MOSFET), device, on a semiconductor substrate, comprising the steps of:

forming a well region in a top portion of said semiconductor substrate;

forming an initial gate insulator layer on said well region, via a first step, of a two step, in situ steam generated, (ISSG), procedure, wherein said first step, of said two step, ISSG procedure, is performed in a furnace, and comprised of a first oxidation procedure, and comprised of an in situ first anneal procedure; and performing a second step, of said two step, ISSG procedure, in situ, in said furnace, to form a final gate insulator layer on said well region, with said second step, of said two step, ISSG procedure, comprised of a second oxidation procedure, and comprised of an in situ, second anneal procedure.

2. The method of claim 1, wherein said well region, formed in a top portion of said semiconductor substrate, is an N well region, formed via ion implantation of arsenic or phosphorous ions.

3. The method of claim 1, wherein said well region, formed in a top portion of said semiconductor substrate, is a P well region, formed via ion implantation of boron or $BF_2$ ions.

4. The method of claim 1, wherein said initial gate insulator layer is a silicon dioxide layer, formed at a physical thickness between about 8 to 12 Angstroms.

5. The method of claim 1, wherein said first oxidation procedure, performed during said first step, of said two step, ISSG procedure, is performed at a temperature between about 600 to 800° C., in a steam ambient.

6. The method of claim 1, wherein said in situ first anneal procedure, performed during said first step, of said two step, ISSG procedure, is performed at a temperature between about 800 to 1000° C., in a nitrous oxide, (NO), ambient.

7. The method of claim 1, wherein said final gate insulator layer is a silicon dioxide layer, formed at a physical thickness between about 10 to 20 Angstroms.

8. The method of claim 1, wherein said second oxidation procedure, performed during said second step, of said two step, ISSG procedure, is performed at a temperature between about 600 to 800° C., in a steam ambient.

9. The method of claim 1, wherein said in situ second anneal procedure, performed during said second step, of said two step, ISSG procedure, is performed at a temperature between about 800 to 1000° C., in an NO ambient.

10. A method of forming a silicon dioxide, gate insulator layer, for a P channel, (PMOS), device, on a semiconductor substrate, featuring a two step, in situ steam generated, (ISSG), procedure to form said silicon dioxide, gate insulator layer, comprising the step of:

forming an N well region, in a top portion of said semiconductor substrate;

performing a pre-clean procedure;

forming an initial silicon dioxide, gate insulator layer, on said N well region, via a first step of said two step, ISSG procedure, with said first step of said two step, ISSG procedure performed in a furnace, and comprised of a first steam oxidation procedure, and an in situ first anneal procedure, performed in a nitrous oxide, (NO), ambient; and converting said initial silicon dioxide, gate insulator layer, to a final silicon dioxide, gate insulator layer, on said N well region, via a second step of said two step, ISSG procedure, performed in situ in said furnace, and comprised of a second steam oxidation procedure, and an in situ second anneal procedure, performed in a NO ambient.

11. The method of claim 10, wherein said N well region, formed in a top portion of said semiconductor substrate, is obtained via an ion implantation procedure, using arsenic or phosphorous ions.

12. The method of claim 10, wherein said pre-clean procedure is performed using a solution of DHF acid.

13. The method of claim 10, wherein said initial silicon dioxide, gate insulator layer, is formed to a physical thickness between about 8 to 12 Angstroms, during said first step, of said two step ISSG procedure.

14. The method of claim 10, wherein said first steam oxidation procedure, performed during said first step, of said two step, ISSG procedure, is performed at a temperature between about 600 to 800° C., in a steam ambient.

15. The method of claim 10, wherein said in situ first anneal procedure, performed during said first step, of said two step, ISSG procedure, in a NO ambient, is performed at a temperature between about 800 to 1000° C., for a time between about 10 to 30 sec.

16. The method of claim 10, wherein said final silicon dioxide, gate insulator layer is formed to a physical thickness between about 10 to 20 Angstroms, during said second step of said two step, ISSG procedure.

17. The method of claim 10, wherein said second steam oxidation procedure, performed during said second step, of said two step, ISSG procedure, is performed at a temperature between about 600 to 800° C., in a steam ambient.

18. The method of claim 10, wherein said in situ second anneal procedure, performed during said second step, of said two step, ISSG procedure, is performed at a temperature between about 800 to 1000° C., in an NO ambient, for a time between about 10 to 30 sec.

* * * * *